(12) United States Patent
Park

(10) Patent No.: US 7,935,561 B2
(45) Date of Patent: May 3, 2011

(54) METHOD OF FORMING SHIELDED GATE FET WITH SELF-ALIGNED FEATURES

(75) Inventor: Chanho Park, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 144 days.

(21) Appl. No.: 12/480,031

(22) Filed: Jun. 8, 2009

(65) Prior Publication Data

US 2009/0246923 A1  Oct. 1, 2009

Related U.S. Application Data

(63) Continuation of application No. 11/536,584, filed on Sep. 28, 2006, now Pat. No. 7,544,571, which is a continuation-in-part of application No. 11/533,493, filed on Sep. 20, 2006, now abandoned.

(51) Int. Cl.
 *H01L 23/60* (2006.01)
(52) U.S. Cl. ................... 438/70; 257/E21.419
(58) Field of Classification Search .................... 438/70, 438/FOR. 192; 257/409, 508, 630, E21.419
See application file for complete search history.

(56) References Cited

U.S. PATENT DOCUMENTS

| | | | |
|---|---|---|---|
| 4,954,854 A | 9/1990 | Dhong et al. | |
| 5,780,340 A | 7/1998 | Gardner et al. | |
| 6,274,437 B1 | 8/2001 | Evans | |
| 6,489,204 B1 | 12/2002 | Tsuiu | |
| 6,548,856 B1 | 4/2003 | Lin et al. | |
| 6,720,638 B2 * | 4/2004 | Tran | 257/499 |
| 6,740,920 B2 | 5/2004 | Chidambarrao et al. | |
| 6,802,719 B2 | 10/2004 | Finney | |
| 6,815,751 B2 | 11/2004 | Brown et al. | |
| 6,861,703 B2 | 3/2005 | Inagawa et al. | |
| 6,958,275 B2 | 10/2005 | Metzler | |
| 6,964,895 B2 | 11/2005 | Hsu | |
| 6,964,903 B2 | 11/2005 | Forbes et al. | |
| 7,345,342 B2 | 3/2008 | Challa et al. | |
| 7,416,948 B2 * | 8/2008 | Kraft et al. | 438/270 |
| 7,446,374 B2 * | 11/2008 | Thorup et al. | 257/330 |
| 7,476,589 B2 * | 1/2009 | Grebs et al. | 438/270 |

(Continued)

FOREIGN PATENT DOCUMENTS

TW  200824120 A  6/2008

(Continued)

OTHER PUBLICATIONS

Non-Final Office Action for U.S. Appl. No. 11/533,493, mailed Nov. 13, 2007, 6 pages.

(Continued)

*Primary Examiner* — George Fourson
(74) *Attorney, Agent, or Firm* — Kilpatrick Townsend & Stockton LLP

(57) ABSTRACT

A method for forming a shielded gate field effect transistor includes the following steps. Trenches are formed in a semiconductor region of a first conductivity type. A shield electrode is formed in a bottom portion of each trench, the shield electrode being insulated from the semiconductor region by a shield dielectric. A gate electrode recessed in each trench is formed over the shield electrode, the gate electrode being insulated from the shield electrode. Using a first mask, a body region of a second conductivity type is formed in the semiconductor region by implanting dopants. Using the first mask, source regions of the first conductivity type are formed in the body region by implanting dopants.

34 Claims, 14 Drawing Sheets

U.S. PATENT DOCUMENTS

| | | | |
|---|---|---|---|
| 7,489,011 B2* | 2/2009 | Yilmaz | 257/409 |
| 7,544,571 B2 | 6/2009 | Park | |
| 7,713,822 B2* | 5/2010 | Thorup et al. | 438/270 |
| 7,807,536 B2* | 10/2010 | Sreekantham et al. | 438/270 |
| 2002/0074585 A1 | 6/2002 | Tsang et al. | |
| 2003/0075758 A1 | 4/2003 | Sundaresan et al. | |
| 2003/0168687 A1 | 9/2003 | Chidambarrao et al. | |
| 2004/0113207 A1 | 6/2004 | Hsu et al. | |
| 2005/0056892 A1 | 3/2005 | Seliskar | |
| 2006/0163631 A1* | 7/2006 | Chen et al. | 257/296 |
| 2006/0237781 A1 | 10/2006 | Marchant et al. | |
| 2008/0124870 A1 | 5/2008 | Park | |
| 2008/0199997 A1* | 8/2008 | Grebs et al. | 438/270 |
| 2009/0166728 A1* | 7/2009 | Pan | 257/330 |
| 2010/0065905 A1* | 3/2010 | Pan | 257/330 |
| 2010/0123220 A1* | 5/2010 | Burke et al. | 257/630 |
| 2010/0258855 A1* | 10/2010 | Yilmaz et al. | 257/328 |

FOREIGN PATENT DOCUMENTS

| | | |
|---|---|---|
| WO | WO 2008/036603 A1 | 3/2008 |

OTHER PUBLICATIONS

Non-Final Office Action for U.S. Appl. No. 11/536,584, mailed Jul. 17, 2008, 12 pages.

Notice of Allowance for U.S. Appl. No. 11/536,584, mailed Feb. 6, 2009, 6 pages.

International Search Report of the International Searching Authority for PCT Application No. PCT/US07/78649, mailed Jan. 24, 2008, 1 page.

Written Opinion of the International Searching Authority for PCT Application No. PCT/US2007/078649, mailed Jan. 24, 2008, 8 pages.

International Search Report of the International Searching Authority for PCT Application No. PCT/US2007/078649, mailed Jun. 19, 2008, 2 pages.

Written Opinion of the International Searching Authority for PCT Application No. PCT/US2007/078649, mailed Jun. 19, 2008, 9 pages.

International Preliminary Report on Patentability for PCT Application No. PCT/US2007/078649, mailed Mar. 24, 2009, 9 pages.

* cited by examiner

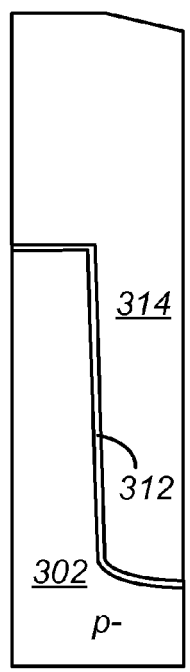
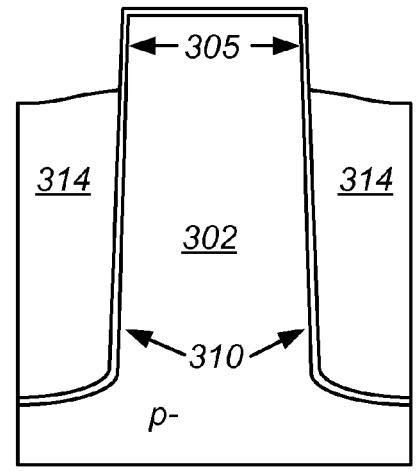
FIG. 3E
FIG. 3F
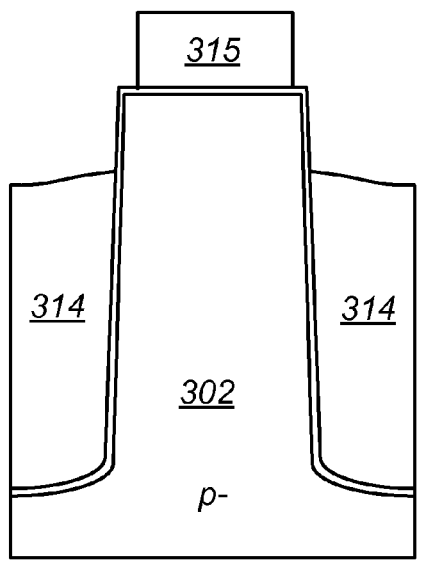
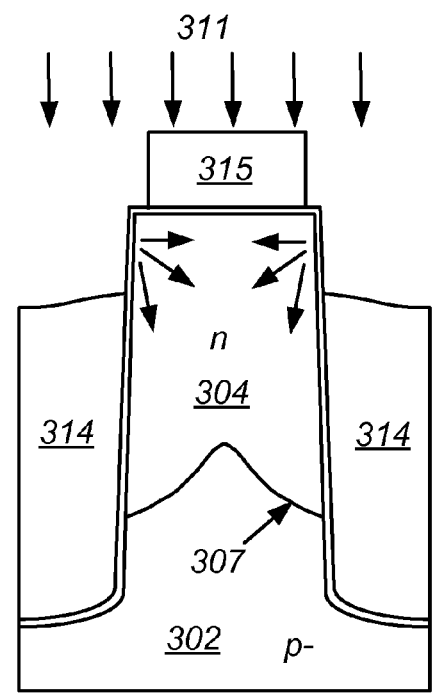
FIG. 3G
FIG. 3H

METHOD OF FORMING SHIELDED GATE FET WITH SELF-ALIGNED FEATURES

CROSS-REFERENCE TO RELATED APPLICATIONS

This application is a continuation of U.S. application Ser. No. 11/536,584, filed Sep. 28, 2006, now U.S. Pat. No. 7,544,571 which is a continuation-in-part of U.S. application Ser. No. 11/533,493, filed Sep. 20, 2006, now abandoned, all of which are incorporated by reference in their entirety for all purposes.

BACKGROUND OF THE INVENTION

The present invention relates in general to semiconductor power field effect transistors (FETs) and in particular to shielded gate power FETs with self aligned features.

The vertical trench gate MOSFET has been widely used in power devices for its superior performance characteristics including high speed and low on resistance, $R_{DSon}$. The $R_{DSon}$ can be further reduced by increasing the trench density. This may be achieved by shrinking the cell pitch or the size of devices, to enable more MOSFETs to be formed per square area of silicon. The cell pitch is determined by the width of the trench, source and body regions.

However, reducing the cell pitch is limited by manufacturing and design limitations because features cannot generally be made smaller than the resolution of photolithography tools. Changing the lithography design is a costly approach to reducing the cell pitch. Moreover, misalignment tolerances in the masking steps for forming the source and heavy body regions have hindered the cell pitch reduction efforts. While some techniques for achieving self-aligned features in FETs have been disclosed, these techniques typically require more process steps and increased process complexity, and thus are not cost-effective techniques.

Thus, there is a need for improved FETs and methods of forming the same.

BRIEF SUMMARY OF THE INVENTION

In accordance with another embodiment of the invention, a shielded gate field effect transistor is formed as follows. Trenches are formed in a semiconductor region of a first conductivity type. A shield electrode is formed in a bottom portion of each trench, the shield electrode being insulated from the semiconductor region by a shield dielectric. A gate electrode recessed in each trench is formed over the shield electrode, the gate electrode being insulated from the shield electrode. Using a first mask, a body region of a second conductivity type is formed in the semiconductor region by implanting dopants. Using the first mask, source regions of the first conductivity type are formed in the body region by implanting dopants.

In one embodiment, when implanting dopants to form the body region, the first mask covers a top surface of the semiconductor region between adjacent trenches such that a substantial amount of the implant dopants enter the semiconductor region through upper trench sidewalls not covered by the recessed gate electrode.

In another embodiment, the trenches are formed using the first mask.

In another embodiment, a second mask is used in forming the trenches.

In another embodiment, the first mask comprises photoresist.

In another embodiment, the first mask comprises one of oxide, nitride, and a composite layer including nitride and oxide.

In another embodiment, the first mask is formed over a surface of the semiconductor region before the trenches are formed and is used to define the trenches.

In another embodiment, the first mask is formed over a surface of the semiconductor region after forming the trenches.

In another embodiment, a bottom boundary of the body region has a corrugated profile.

In another embodiment, a bottom of the body region is deepest at sidewalls of the trenches and shallowest at a midpoint between adjacent trenches.

In another embodiment, prior to forming the gate electrode, a gate dielectric layer lining upper sidewalls of each trench and extending over the shield electrode is formed. The gate dielectric layer is thinner than the shield dielectric.

In another embodiment, prior to forming the gate electrode, an inter-electrode dielectric layer extending over the shield electrode in each trench is formed, and then a gate dielectric layer lining upper sidewalls of each trench is formed. The gate dielectric layer is thinner than the shield dielectric.

In another embodiment, a dielectric material is formed in each trench over the gate electrode. The first mask is removed, and then an interconnect layer contacting the source regions and the body region is formed.

In another embodiment, an implant energy in the range of about 150 KeV to about 220 KeV is used in forming the body region.

The following detailed description and the accompanying drawings provide a better understanding of the nature and advantages of the present invention.

BRIEF DESCRIPTION OF THE DRAWINGS

FIGS. 3A-3K are simplified cross section views at various stages of a process for forming a trench gate MOSFET according to another embodiment of the invention;

DETAILED DESCRIPTION OF THE INVENTION

In accordance with embodiments of the invention, trench gate FETs and shielded gate FETs with self-aligned features which enable significant reductions in the on-resistance are formed using manufacturing processes with significantly fewer number of process steps and fewer masking steps than conventional processes, resulting in low manufacturing cost. In one embodiment, the same mask is used to form gate trenches, the body region, and source regions, thus forming a highly self-aligned transistor. The self-aligned source and body regions and the unique profile of dopants in the body region enable significant reduction in the channel length and thus in the transistor on-resistance compared to conventional trench gate and shielded gate FETs. The significant reduction in the transistor on-resistance in turn enables reducing the gate-to-source capacitance Cgs and gate-to-drain capacitance Cgd for the same current capacity. The unique profile of dopants in the body region results in inherent formation of heavy body regions and thus eliminates the mask and process steps for forming heavy regions. Methods for forming trench gate and shielded gate FETs with these and other improved features according to embodiments of the invention are described next.

Figure 1:
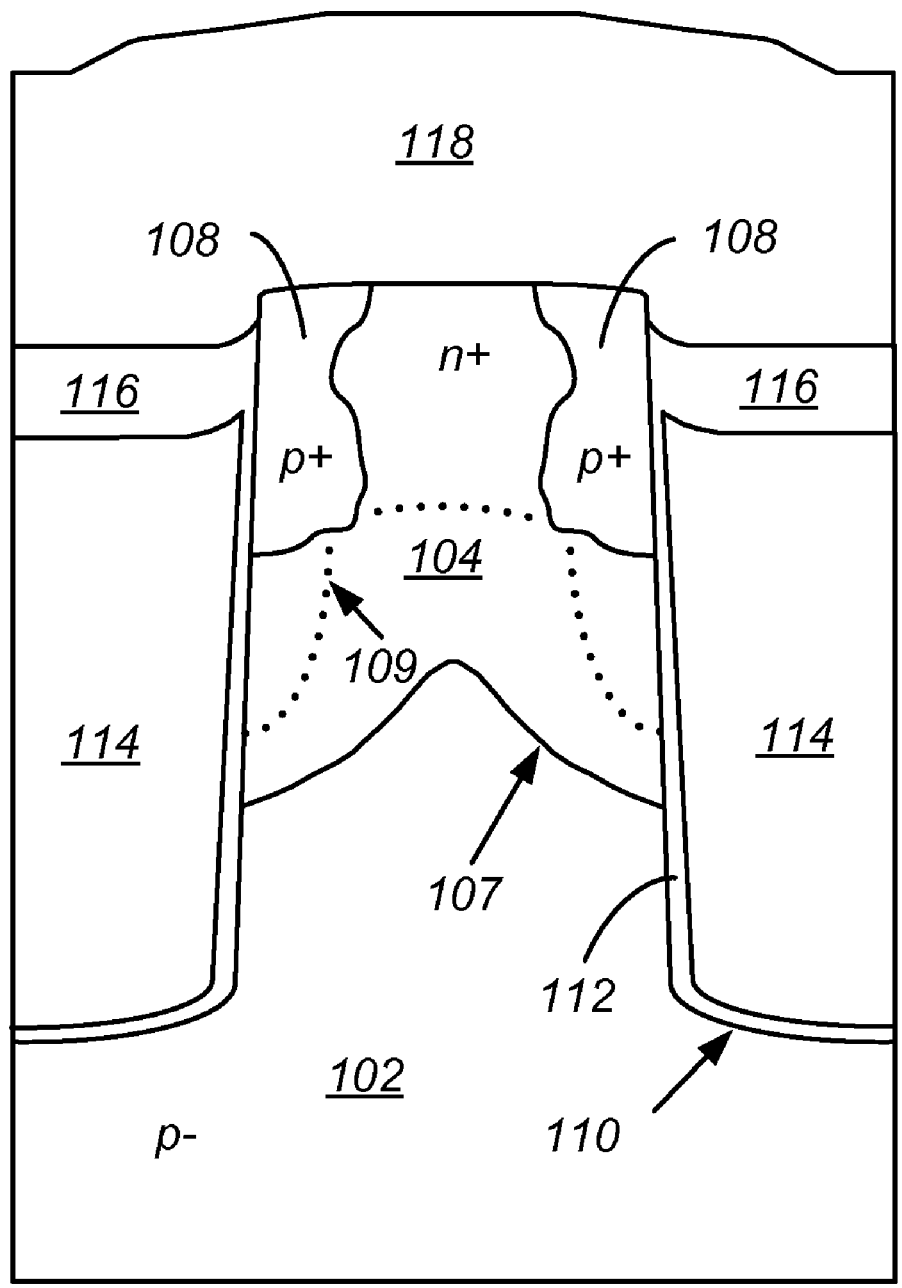
FIG. 1 shows a cross section view of a trench gate MOSFET formed using a process technique according to an embodiment of the invention.

FIG. 1 shows a cross section view of a p-channel trench gate MOSFET formed using a process technique according to an embodiment of the invention. Trenches 110 extending into p-type drift region 102 include a dielectric layer 112 (e.g., gate oxide) lining the trench sidewalls and bottom, and a recessed gate electrode 114 (e.g., comprising doped polysilicon). A dielectric layer 116 fills the portion of each trench 110 over gate electrode 114. N-type body region 107 extends into silicon region 102 between adjacent trenches 110, and forms a body-drift junction 107 that tapers down from a center of the mesa region toward trenches 110. P-type source regions 108 are formed in body region 104 adjacent trenches 110.

As described in more detail further below, the method by which body region 104 is formed results in a unique doping profile in body region 104. In one embodiment, the doping profile in body region 104 is a Gaussian profile which reduces from higher doping concentrations along upper portions of body region 104 and along the outer walls of trenches 110 to lower doping concentrations along the lower center of body region 104. Dotted lines 109 are included in FIG. 1 to provide a rough delineation between the higher doped regions (above dotted lines 109) and lower doped regions (below dotted lines 109) of body region 104. This doping profile in body region 104 advantageously eliminates the need for forming a heavy body region since upper portion of the body region 104 (i.e., the portion above dotted line 109 between source regions 108 marked as n+) is highly doped and thus serve as the heavy body region. The ruggedness of the transistor is not adversely affected since the body region doping profile ensures that minimum spacing is maintained between body-drift junction 107 and the higher doped portions of body region 104.

Figure 2A:
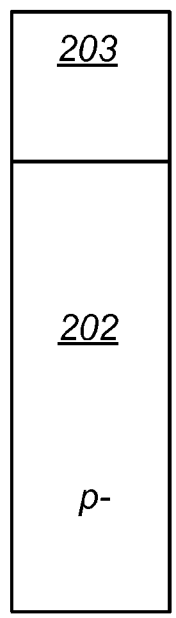
FIGS. 2A-2J are simplified cross section views at various stages of a process for forming a trench gate MOSFET according to one embodiment of the invention.
Figure 2B:
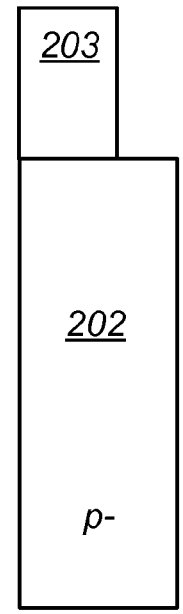
Figure 2C:
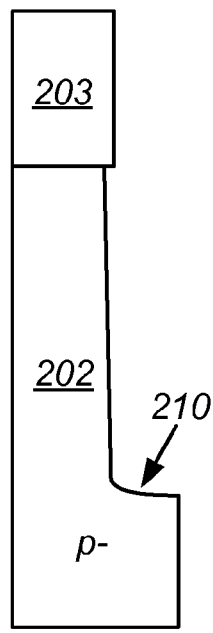

FIGS. 2A-2J are simplified cross section views at various stages of a process for forming a trench gate MOSFET according to one embodiment of the invention. In FIG. 2A, a hard mask 203 is formed over a p-type silicon region 202. In one embodiment, silicon region 202 comprises a highly doped p-type substrate with a lightly doped p-type epitaxial layer extending over it. In FIG. 2B, mask 203 is patterned and etched to define openings through which trenches are formed. Hard mask 203 may comprise oxide, nitride, composite layers of oxide and nitride, or other types of materials as known in the art. In FIG. 2C, silicon surfaces exposed through openings in mask 203 are recessed to form trenches 210. Conventional silicon etch techniques may be used to recess the silicon.

Figure 2D:
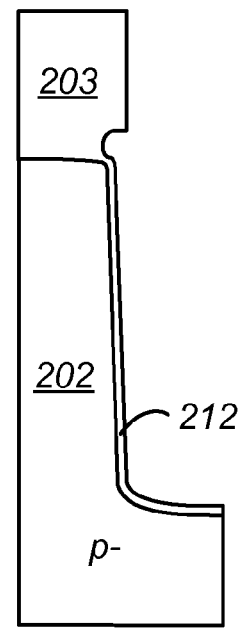

A soft etch may optionally be performed on the silicon to remove any surface damage from the trench etch. A sacrificial oxide is then grown and subsequently etched (e.g., using wet etch) in preparation for forming a gate dielectric layer. In FIG. 2D, a gate dielectric layer 212 (e.g., comprising oxide) lining the trench sidewalls and bottom is formed using for example, conventional thermal oxidation. In one embodiment, a thick bottom dielectric (TBD) having a greater thickness than the gate dielectric is formed along the bottom of trenches 210 to reduce the gate to drain capacitance Cgd.

Figure 2E:
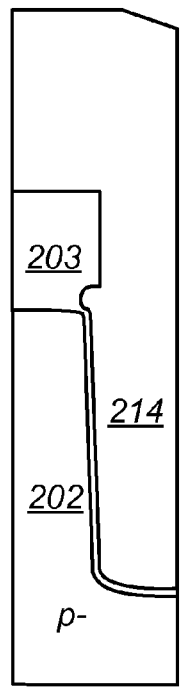
Figure 2F:
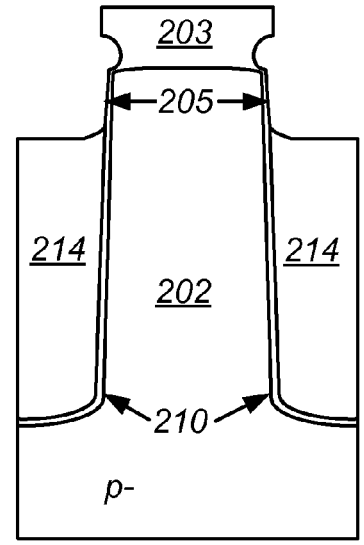

In FIG. 2E, a conductive material 214, such as doped polysilicon, filling the trench is formed using known techniques. In FIG. 2F, conductive material 214 is then recessed to below the surface of the silicon mesa, exposing upper sidewalls 205 of trenches 210. The recessed conductive material form gate electrodes 214. The etch step for recessing conductive material thins down hard mask 203 some. In conventional processes, hard mask 203 is completely removed after trench 210 is etched and before gate electrode 214 is formed. In contrast, in the present embodiment, hard mask 203 is kept after forming gate electrode 214 and used in subsequent process steps to form self aligned features.

Figure 2G:
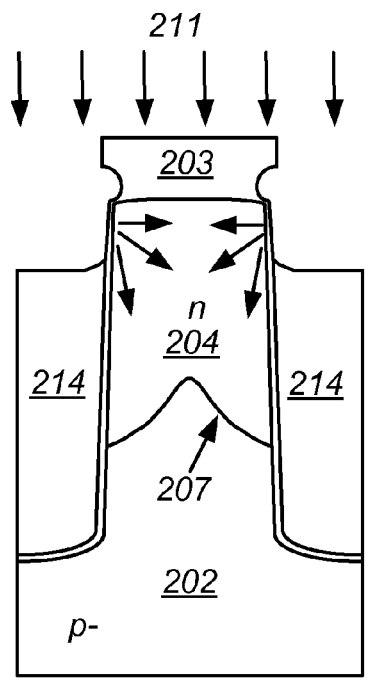

In FIG. 2G, a body implant 211 is carried out to form body region 204. Given proper implant energy and dopant concentration, the dopant impurities enter silicon region 202 primarily through the upper trench sidewalls not covered by gate electrodes 204. Mask 203 substantially blocks implant dopants 211 from entering silicon region 204 through the top surface of the mesa regions. Similarly, gate electrodes 214 block implant dopants 211 from entering silicon region 202 along middle and lower trench sidewalls. As the arrows inside body region 204 indicate, implant dopants 211 enter directly or are scattered into upper trench sidewall. This advantageously results in formation of a body region 204 with a corrugated junction 207, that is, junction 207 is deepest near the trench sidewalls and shallowest at or near a midpoint between trenches 210. In contrast, the junction between the body region and underlying silicon layer in conventional structures is substantially flat or planar.

In addition to the above masking/implant technique, the implant energy and implant dose are carefully selected to obtain the corrugated junction 207 and the desired doping profile in body region 204. While conventional processes typically use a body implant energy in the range of about 50-100 KeV, a significantly higher implant energy in range of about 150 KeV to about 220 KeV is used in the step depicted by FIG. 2G. In one embodiment, a body implant energy of about 180 KeV and a body implant dose of about $1.55 \times 10^{13}$ cm$^{-2}$ was found to provide optimum performance and physical characteristics.

The higher implant energy drives the implant dopants deeper into silicon region 202. Note that despite the higher implant energy, body region 204 in its final form is significantly shallower than conventional body regions. This is because the body drive-in necessary in conventional processes is eliminated. Elimination of the body drive-in also minimizes both the thermal budget and the out-diffusion of substrate dopants into the overlying drift region.

The above technique for forming body region 204 results in an optimum doping profile in the body region wherein the body doping concentration reduces from higher concentration levels near the mesa surface and along the upper and middle trench sidewalls to lower concentration levels in the lower-center regions of the body region and along the corrugated junction 207. The dotted lines in FIGS. 1 and 2J are included to provide a rough diagrammatic delineation of higher concentration regions (above the dotted lines) and lower concentration regions (below the dotted lines), and are not intended to indicate abrupt changes in doping concentration. The doping profile in the body region minimizes the spacing between corrugated junction 207 and the higher doping regions of body region, thus ensuring that the punch-through characteristics of the device is not compromised.

According to another embodiment of the invention, a two-pass angled implant is carried out in forming body region 204.

For example, dopants may enter from a 30-60 degree tilt at each side of hard mask 203. In yet another embodiment, prior to the body implant, mask 203 is partially etched to expose small mesa surface areas adjacent the trenches so that some of the body implant dopants enter silicon region 202 through these exposed small surface mesa areas.

Figure 2H:
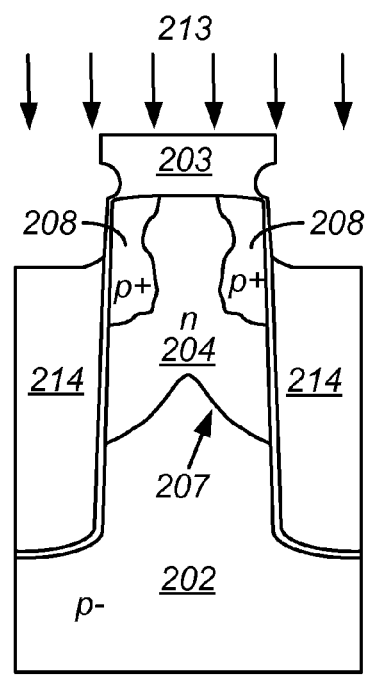

In FIG. 2H, without removing mask 203, highly doped p-type source regions 208 are formed in body region 204 adjacent trenches 210 by carrying out a source implant 213. As in the body implant step, the source implant dopants enter body region 204 through the upper trench sidewalls. In one embodiment, a source implant energy of about 15 KeV and an implant dose of about $5 \times 10^{15}$ cm$^{-2}$ is used. A conventional rapid thermal annealing (RTA) may be carried out after the source implant to activate the dopants in both the body and source regions.

Because the same mask 203 and gate electrode 214 define the window through which both body implant dopants and source implant dopants enter silicon region 202, the body and source regions are aligned to one another. That is, as compared to prior art techniques, this technique provides a far greater degree of precision and control in forming the body and source regions and their physical characteristics relative to one another. This enables tight control over the channel length, which is defined by the spacing between the bottom of source regions 208 and bottom-most portion of body junction 207 along the trench sidewalls. Because of the high precision in defining the channel length and the relatively high body doping concentration along a substantial portion of the channel region, the channel length can be significantly reduced. This in turn reduces the transistor on-resistance as well as the gate to source capacitance.

Figure 2I:
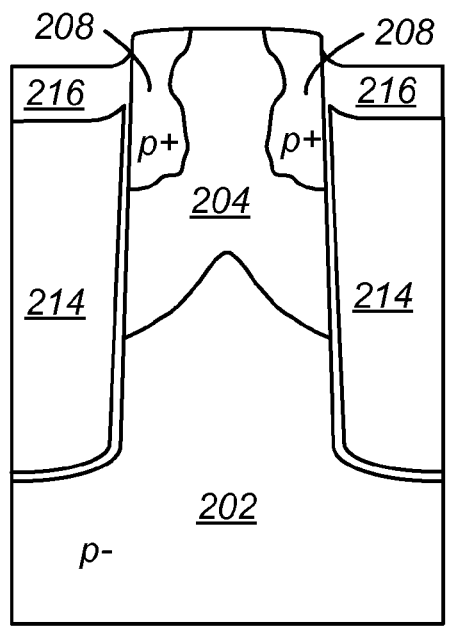
Figure 2J:
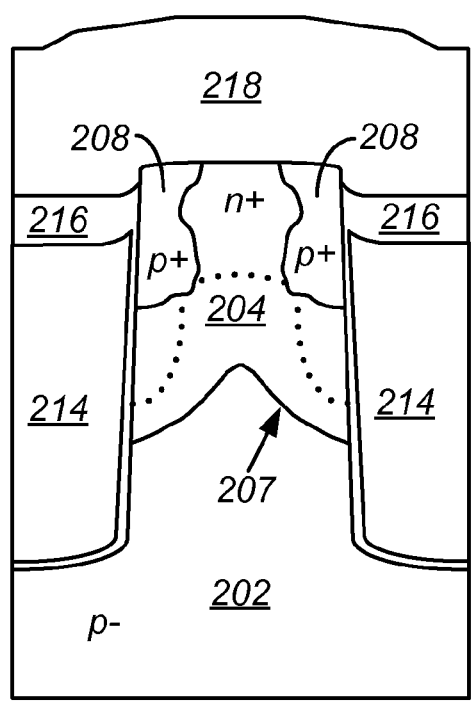

In FIG. 2I, hard mask 203 is removed, and in FIG. 2J a layer of dielectric 216 such as BPSG is formed in each trench over gate electrodes 214 using conventional methods. A top-side interconnect layer 218 (e.g., comprising metal) contacting source regions 208 and body region 204 is formed over the structure using known techniques. Other process steps for completing the structure, such as the back-side metal formation, are carried out according to conventional techniques.

In FIG. 2J, the upper portion of body region 204, which as described above has high dopant concentration, is marked as n+. Because this area of the body region has a sufficiently high doping concentration, it serves as the heavy body region thus eliminating the need for forming heavy body regions. This simplifies the process by both reducing the number of process steps and eliminating the misalignment issues associated with the heavy body region. Thus, as the above-described process and corresponding figures illustrate, only one mask is used in defining and/or forming all of the gate trenches, the body region (and the heavy body region inherently formed therein) and the source region, resulting in a highly self-aligned structure and substantially simplifying the process by reducing the number of required masks and processing steps.

Figure 3A:
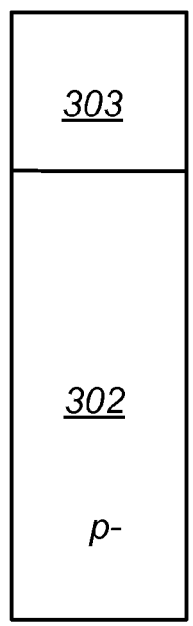
Figure 3B:
Figure 3C:
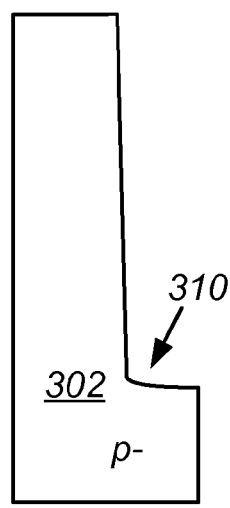
Figure 3D:
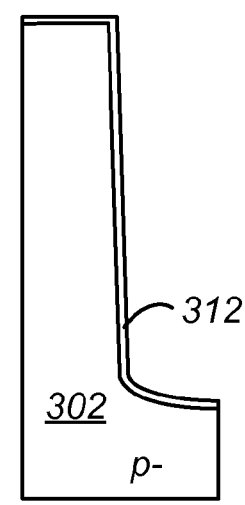

FIGS. 3A-3K are simplified cross section views at various stages of a process for forming a trench gate MOSFET according to another embodiment of the invention. In this embodiment, instead of using the same mask to form the trenches, the body region and the source regions, one mask is used in forming the trenches and a separate mask is used in forming the body and source regions. The process sequence depicted by FIG. 3A-3C is similar to that depicted by FIGS. 2A-2C, except that after trenches 310 are formed hard mask 303 is removed. In FIG. 2D, gate dielectric layer 312 lining the trench sidewalls and bottom and extending over the mesa surfaces is formed in a similar manner to gate dielectric layer 212 in FIG. 2D. In FIGS. 3E and 3F, recessed gate electrodes 314 are formed in trenches 310 in a similar manner to recessed gate electrodes 214 in FIGS. 2E and 2F.

In FIG. 3G, a mask 315 is formed over the silicon mesa. Mask 315 may comprise photoresist and can be formed by conventional deposition, patterning, and etching techniques. In one embodiment, the width of mask 315 is equal to or slightly less than the width of the mesa region between adjacent trenches to ensure that a substantial amount of the implant dopants in the subsequent body implant enter silicon region 302 through the upper trench sidewalls versus through the mesa surfaces.

Figure 3I:
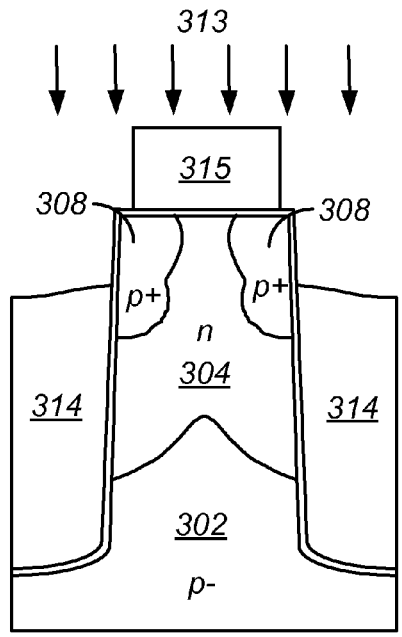

In FIGS. 3H and 3I, body region 304 and its corrugated junction 307 as well as source regions 308 are formed using the same mask 315, in a similar manner to the body and source regions in FIGS. 2G and 2H. Thus, mask 315 functions similarly to hard mask 203 in the previously described embodiment to form self-aligned source and body regions and the corrugated body-drift junction profile. However, the implant dose and implant energy for forming body region 304 may differ depending on the thickness of photoresist mask 315, in order to form features with optimal electrical properties.

Figure 3J:
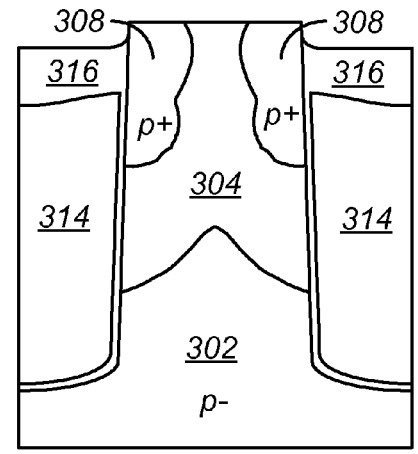
Figure 3K:
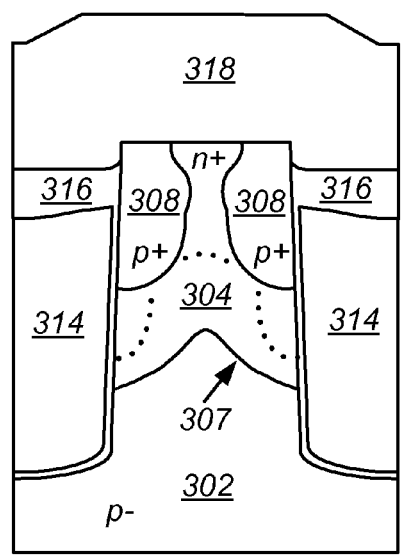

In FIG. 3J, mask 315 is removed, and a layer of dielectric 316 such as BPSG is formed in the trenches over gate electrodes 314 using known techniques. In FIG. 3K, top interconnect layer 318 contacting source regions 308 and body region 304, as well as the remaining features of the structure, are formed in accordance with conventional methods. In FIG. 3K, similar to FIG. 2J, the dotted lines are included to provide a rough diagrammatic delineation of higher concentration regions (above the dotted lines) and lower concentration regions (below the dotted lines) in body region 304, and are not intended to indicate abrupt changes in doping concentration.

While in the embodiments depicted by FIGS. 2A-2J and 3A-3K heavy body regions are inherently formed during the body formation process, in an alternate embodiment, a heavy body implant is carried out after mask 203 (FIG. 2H) and mask 315 (FIG. 3I) are removed to further increase the doping concentration along the upper portion of the body region. The heavy body implant dose would not be so high as to counter dope source regions 308, and thus no mask would be required.

Embodiments of the present invention provide several advantages over the conventional trench power FETs. By carefully controlling the implant energies to form both the body and source regions using the same mask as described above, self alignment of features is achieved. The self aligned features according to embodiments of the invention provide unique advantages. One important advantage is that the sharp alignment of the bottom of the source region and body-drift junction at the trench sidewall decreases the channel length. In conventional trench MOSFETs, the channel length is typically about 0.6 µm. Embodiments of the present invention, in contrast, provide a channel length of 0.3 µm or less.

Figure 4A:
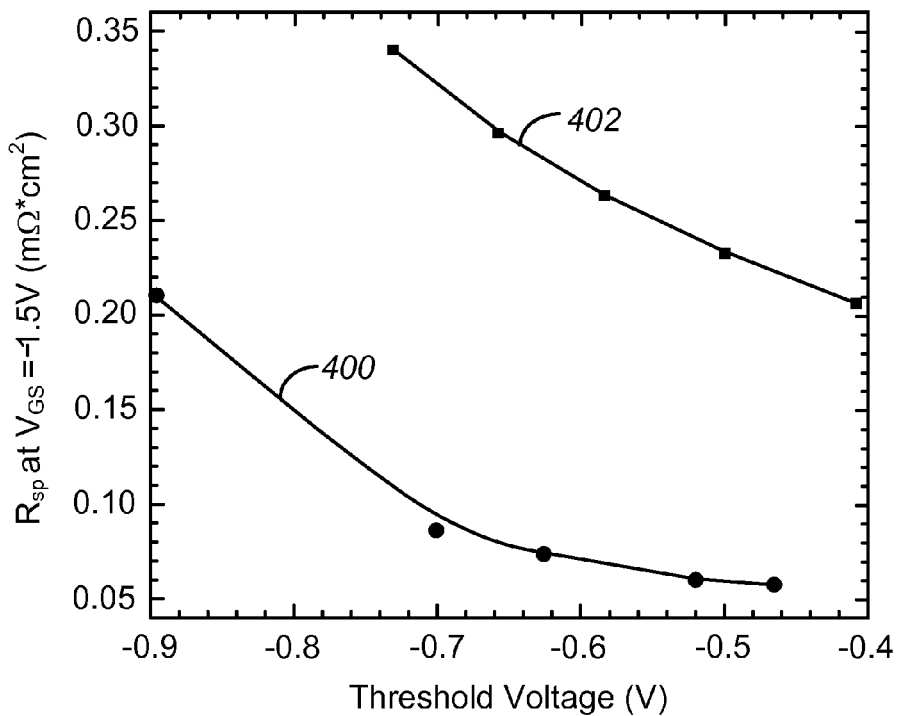
FIGS. 4A and 4B show simulation results for electrical properties of a power MOSFET according to exemplary embodiments of the invention.
Figure 4B:
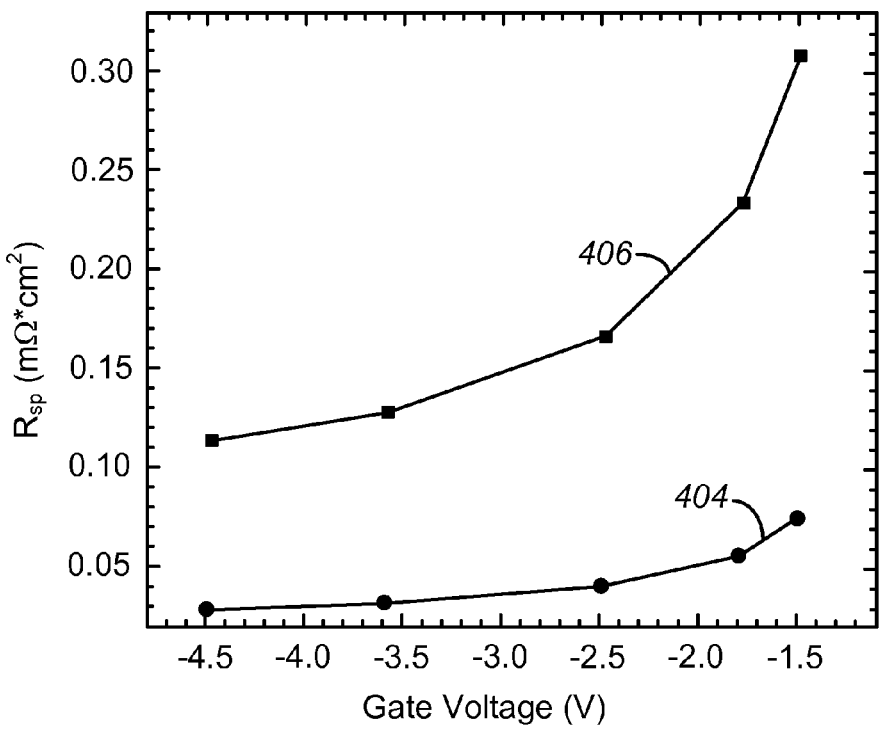

A shorter channel length reduces the on-resistance $R_{DSon}$ of the device. FIGS. 4A and 4B show simulation results for electrical properties of a power MOSFET according to exemplary embodiments of the invention. FIG. 4A shows a graph of the specific resistance Rsp between the source and drain as a function of the threshold voltage measured at the gate voltage of −1.5V. In FIG. 4A, simulated Rsp values for various threshold voltage Vth values are plotted for both a power MOSFET formed according to an exemplary embodiment of the invention (curve 400) and for a power MOSFET formed by conventional methods (curve 402). As shown by curves 400 and 402, the Rsp for the exemplary embodiment of the invention is lower by over 70% compared to the conventional MOSFET.

In FIG. 4B, simulated Rsp values for various gate to source voltages are plotted for a power MOSFET formed according to an exemplary embodiment of the invention (curve 404) and for a power MOSFET formed by conventional methods (curve 406). Once again, the Rsp for the exemplary embodiment of the invention is shown to be lower by over 70% compare to the conventional MOSFET.

Moreover, reducing the channel length in conventional devices is limited by various factors. For example, a very short channel length renders the device vulnerable to punch-through when the depletion layer formed as a result of the reverse-biased body-drift junction pushes deep into the body region and approaches the source regions. Increasing the channel length to compensate the above effect has the undesirable result of increasing the on-resistance $R_{DSon}$ of the transistor. In contrast, in embodiments of the invention, the self aligned source and body regions and the corrugated body-drift junction that follows the contours of the source regions insure that a predetermined minimum spacing between the corrugated junction and the source region is maintained. This coupled with the higher doping concentration in the channel region prevents punch-through even for very short channel lengths.

A shorter channel length as provided by embodiments of the invention provides other advantages, such as a reduction in the overall capacitance of the device. For example, a shorter channel length reduces the gate-to-source capacitance Cgs by reducing the gate-to-channel component of Cgs. Moreover, an overall decrease in $R_{DSon}$ also enables obtaining the same current capacity with fewer gate trenches. This reduces both Cgs and the gate-to-drain capacitance Cgd, by reducing the amount of gate-to-source and gate-to-drain overlap.

Other advantages provided by embodiments of the invention include the elimination of many process steps required in conventional methods. For example, embodiments of the invention as described above provide for the formation of the gate trenches, the body region, and the source regions using one mask. In contrast, in conventional processes, two or three masks are required for the same purpose. Moreover, the additional thermal step to drive in the body region required in conventional processes is also eliminated thus reducing the process steps and minimizing the required thermal budget compared to conventional methods.

Additionally, the masking and process steps for forming heavy body regions is unnecessary for some embodiments of the invention. As discussed above, embodiments of the invention eliminate the additional step of forming a heavy body since the doping of the body region naturally provides a profile with the highest concentration near the surface. The heavy body contact is thus provided inherently, saving additional silicon area and further simplifying the process.

For at least the forgoing reasons, embodiments of the invention also provide simpler and cost effective methods with easy vertical scaling for forming fully self aligned features, in addition to improvements in electrical properties.

Figure 5A:
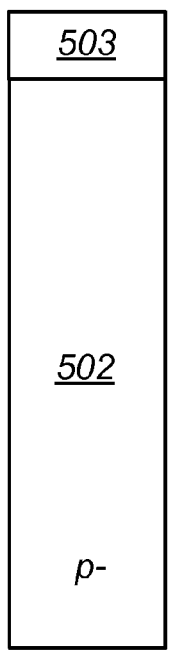
FIGS. 5A-5J are simplified cross section views at various stages of a process for forming a shielded gate MOSFET according to one embodiment of the invention.
Figure 5B:
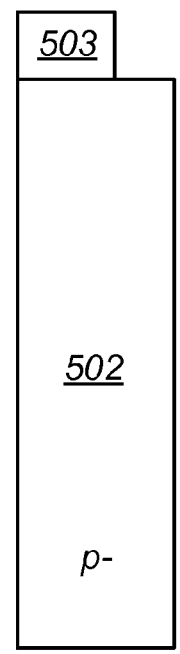
Figure 5C:
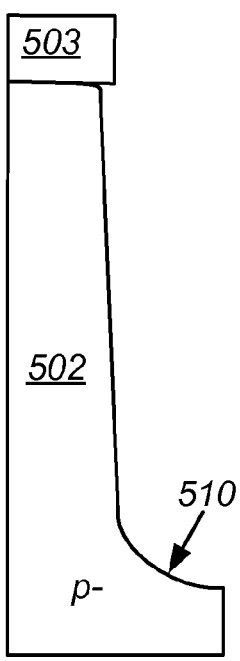
Figure 5D:
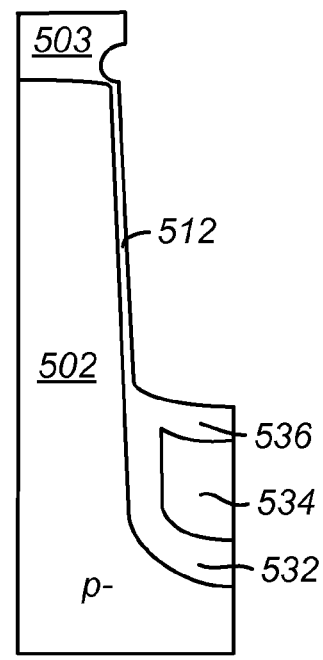

FIGS. 5A-5J are simplified cross section views at various stages of a process for forming a shielded gate MOSFET according to one embodiment of the invention. The process steps depicted by FIGS. 5A-5C are similar to those depicted by FIGS. 2A-2C except that trench 510 in FIG. 5C is extended deeper than trench 210 in FIG. 2C to accommodate forming a shield electrode below the gate electrode. In FIG. 5D, conventional techniques or any one of a number of techniques disclosed in the above-referenced application may be used to form the following: (1) shield dielectric layer 532 (e.g., comprising oxide) lining the lower trench sidewalls and bottom, (2) shield electrode 534 (e.g., comprising polysilicon) in a bottom portion of trench 510, (3) inter-electrode dielectric (IED) 536 over shield electrode 534, and (4) gate dielectric layer 512 (e.g., comprising oxide) lining upper trench sidewalls. Note that shield dielectric 532 is thicker than the gate dielectric 512. Also, although IED 536 is shown to be thicker than gate dielectric layer 512, in one embodiment, the same process for forming gate dielectric layer 512 is used to form the IED (i.e., the IED is the same thickness as that of gate dielectric layer 512).

Figure 5E:
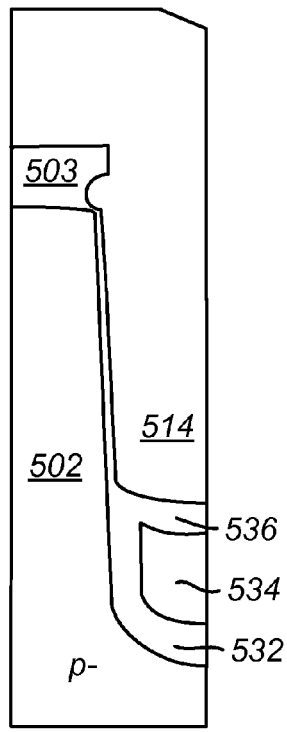
Figure 5F:
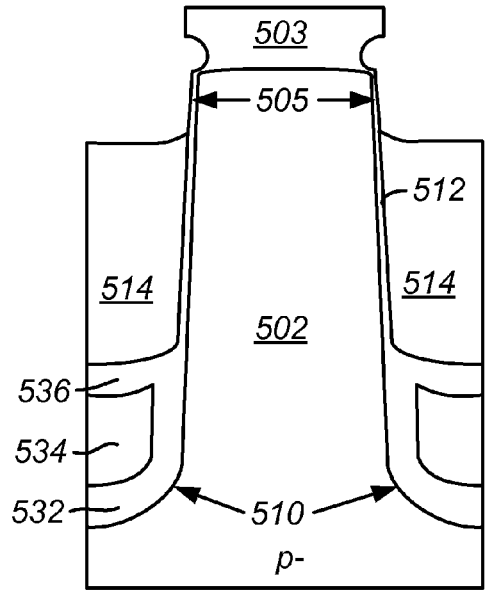
Figure 5G:
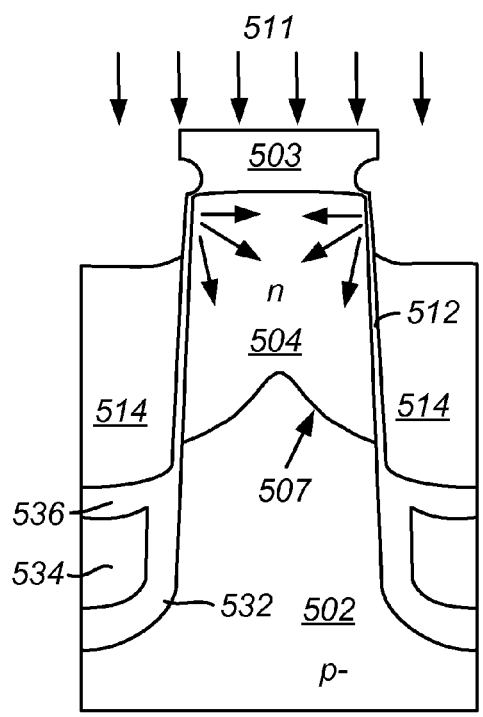
Figure 5H:
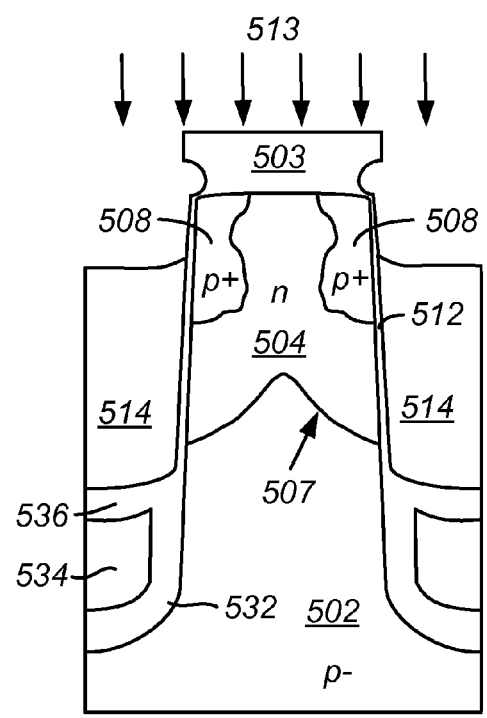
Figure 5I:
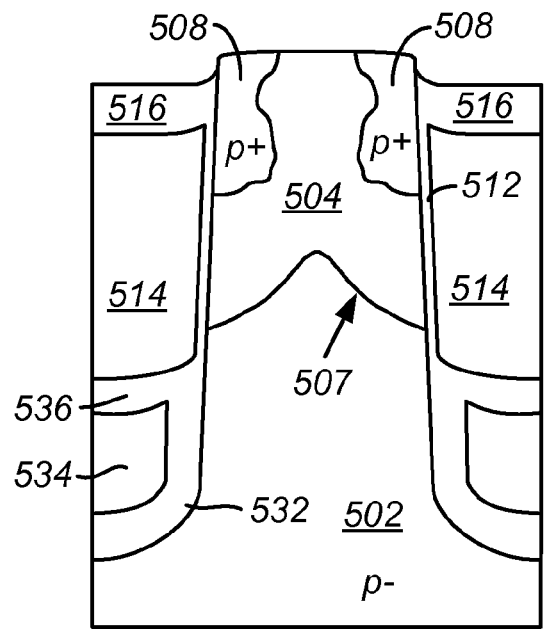
Figure 5J:
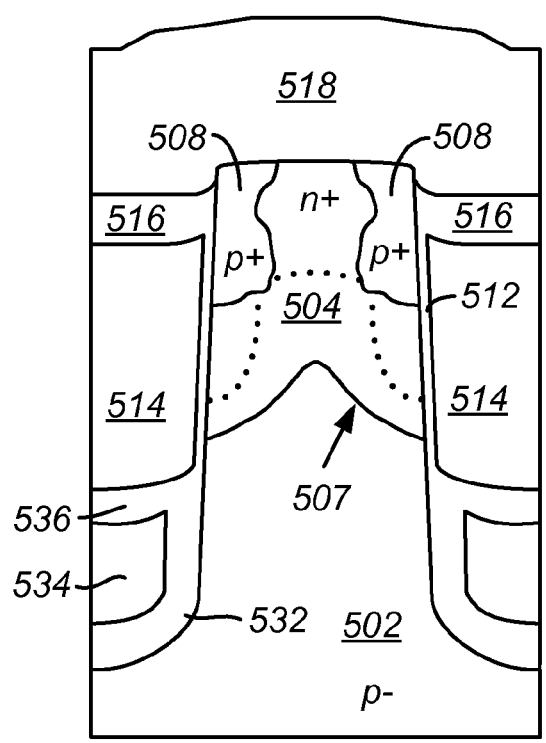

In FIG. 5E, a conductive material 514, such as doped polysilicon, filling the trench is formed over IED 536 using known techniques. In FIG. 5F, conductive material 514 is then recessed to below the surface of the silicon mesa, exposing upper sidewalls 505 of trenches 510. The recessed conductive material forms gate electrode 514. The remaining process steps depicted by FIGS. 5G-5J are similar to those depicted by FIGS. 2G-2J, and thus will not be described. Similarly, the various considerations, embodiments, features and advantages described above in connection with the process steps depicted by FIGS. 2A-2J also apply to corresponding process steps depicted by FIG. 5A-5J and the final structure shown in FIG. 5J. However, the shielded gate structure when combined with the technique for obtaining self-aligned source and body regions results in a MOSFET with superior breakdown voltage, on-resistance characteristics, and switching characteristics.

Figure 6A:
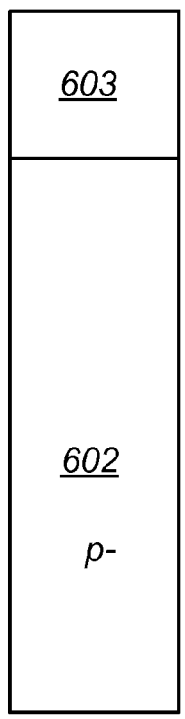
FIGS. 6A-6K are simplified cross section views at various stages of a process for forming a trench gate MOSFET according to another embodiment of the invention.
Figure 6B:
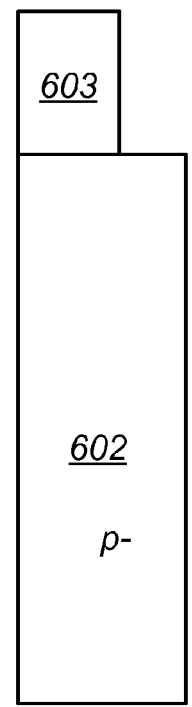
Figure 6C:
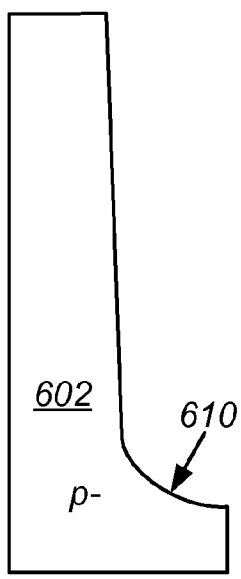

FIGS. 6A-6K are simplified cross section views at various stages of a process for forming another shielded gate MOSFET according to yet another embodiment of the invention. In this embodiment, similar to the embodiment depicted by FIGS. 3A-3K, instead of using the same mask to form the trenches, the body region and the source regions, one mask is used in forming the trenches and a separate mask is used in forming the body and source regions. The process steps depicted by FIGS. 6A-6C are similar to those depicted by FIGS. 3A-3C except that trench 610 in FIG. 6C is extended deeper than trench 310 in FIG. 3C to accommodate forming a shield electrode below the gate electrode.

Figure 6D:
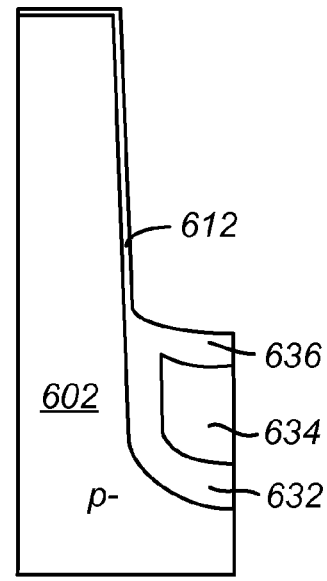

In FIG. 6D, as in the preceding embodiment, conventional techniques or any one of a number of techniques disclosed in the above-referenced application may be used to form the following: (1) shield dielectric layer 632 (e.g., comprising oxide) lining the lower trench sidewalls and bottom, (2) shield electrode 634 (e.g., comprising polysilicon) in a bottom portion of trench 610, (3) inter-electrode dielectric (IED) 636 over shield electrode 634, and (4) gate dielectric layer 612 (e.g., comprising oxide) lining upper trench sidewalls. Note that shield dielectric 632 is thicker than the gate dielectric 612. Also, although IED 636 is shown to be thicker than gate dielectric layer 612, in one embodiment, the same process for forming gate dielectric layer 612 is used to form the IED (i.e., the IED is the same thickness as that of gate dielectric layer 612).

Figure 6E:
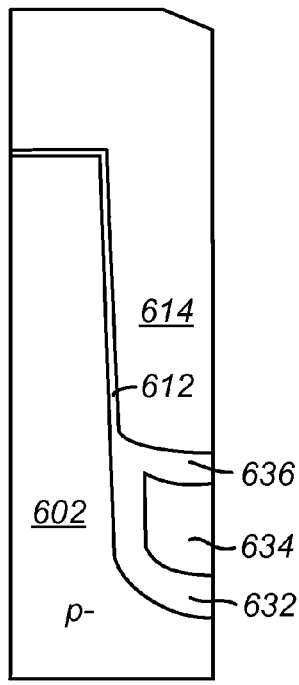
Figure 6F:
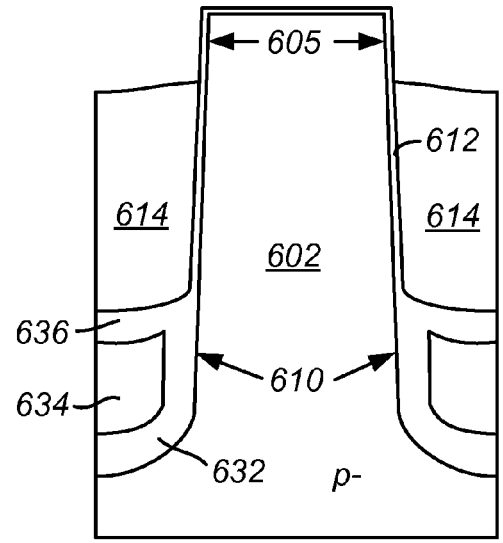
Figure 6G:
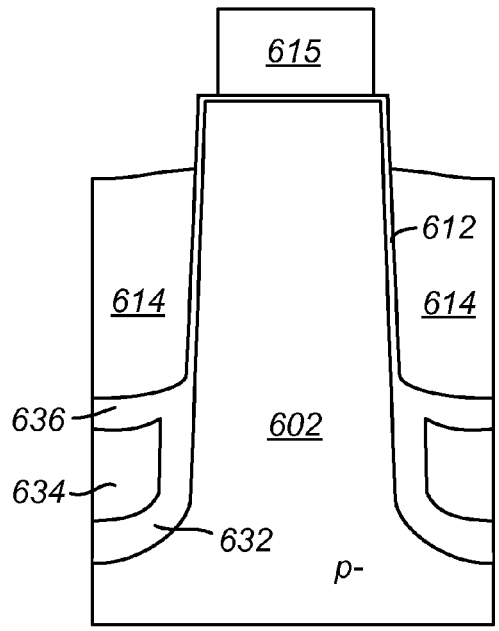
Figure 6H:
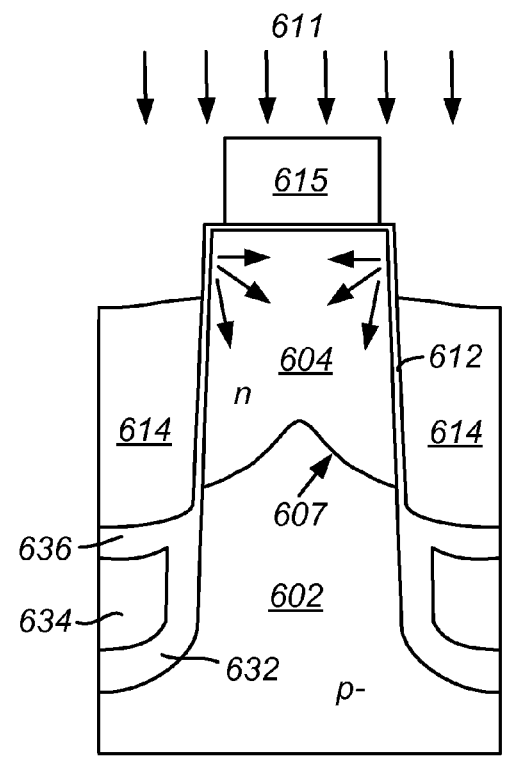
Figure 6I:
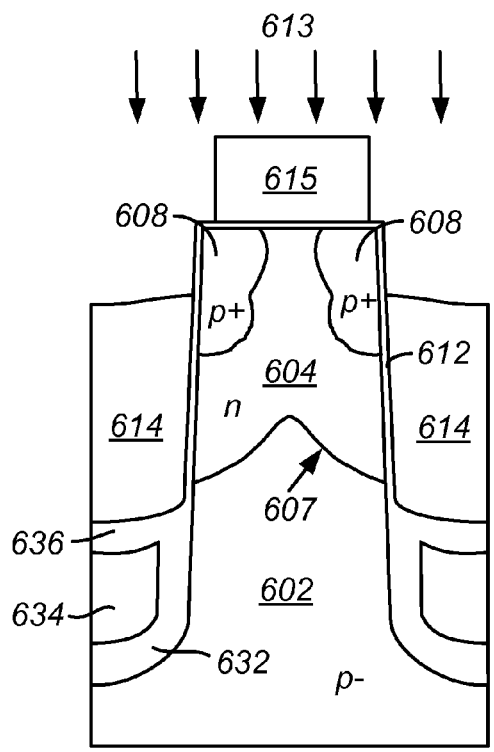
Figure 6J:
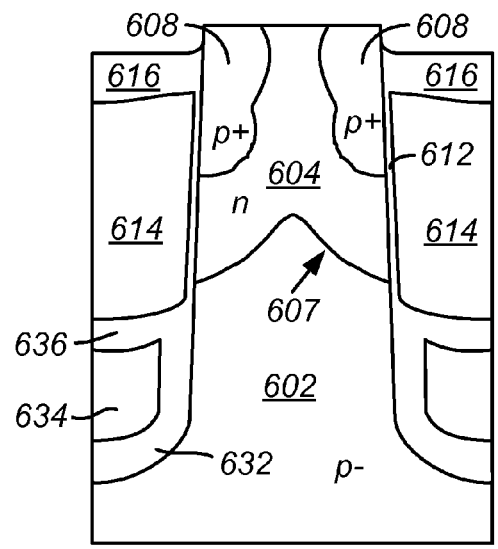
Figure 6K:
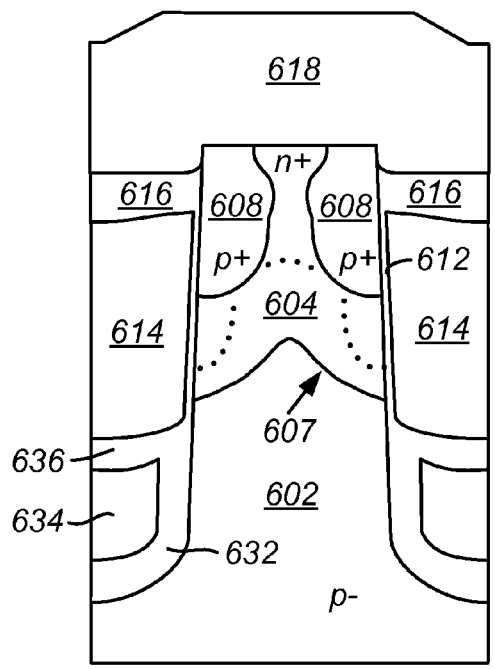

In FIG. 6E, a conductive material 614, such as doped polysilicon, filling the trench is formed over IED 636 using known techniques. In FIG. 6F, conductive material 614 is then recessed to below the surface of the silicon mesa, exposing upper sidewalls 605 of trenches 610. The recessed conductive material forms gate electrode 614. The remaining process steps depicted by FIGS. 6G-6K are similar to those depicted by FIGS. 3G-3K, and thus will not be described. Similarly, the various considerations, embodiments, features and advantages described above in connection with the process steps depicted by FIGS. 3A-3K also apply to corresponding process steps depicted by FIG. 6A-6K. As with the preceding embodiment, by combining the shielded gate structure with the technique for obtaining self-aligned source and body regions in the manner described herein, a MOSFET with superior breakdown voltage, on-resistance characteristics, and switching characteristics is obtained.

Although a number of specific embodiments are shown and described above, embodiments of the invention are not limited thereto. For example, the same process embodiments described herein for forming p-channel FETs may also be used to form n-channel FETs by merely reversing the conductivity type of the various regions. As another example, the trenches in the above embodiments may terminate before reaching the more heavily doped substrate or may extend into and terminate within the substrate. As yet another example, in the embodiments depicted by FIGS. 2A-2J and FIGS. 3A-3K, a thick dielectric layer (thicker than the gate dielectric) may be formed along the bottom of each trench directly beneath the gate electrodes in order to further reduce the gate to drain capacitance in those embodiments.

As another example, the same process embodiments described herein for forming p-channel MOSFETs may also be used to form trench gate p-channel IGBTs by merely changing the p-type substrate to n-type substrate. Also, while the various embodiments described above are implemented in conventional silicon, these embodiments and their obvious variants can also be implemented in silicon carbide, gallium arsenide, gallium nitride, diamond or other semiconductor materials. Further, the features of one or more embodiments of the invention may be combined with one or more features of other embodiments of the invention without departing from the scope of the invention.

Therefore, the scope of the present invention should be determined not with reference to the above description but should, instead, be determined with reference to the appended claims, along with their full scope of equivalents.

What is claimed is:

1. A method for forming a shielded gate field effect transistor, comprising:
    forming trenches in a semiconductor region of a first conductivity type;
    forming a shield electrode in a bottom portion of each trench, the shield electrode being insulated from the semiconductor region by a shield dielectric;
    forming a gate electrode recessed in each trench over the shield electrode, the gate electrode being insulated from the shield electrode;
    using a first mask, forming a body region of a second conductivity type in the semiconductor region by implanting dopants; and
    using the first mask, forming source regions of the first conductivity type in the body region by implanting dopants.

2. The method of claim 1 wherein when implanting dopants to form the body region, the first mask covers a top surface of the semiconductor region between adjacent trenches such that a substantial amount of the implant dopants enter the semiconductor region through upper trench sidewalls not covered by the recessed gate electrode.

3. The method of claim 1 wherein the trenches are formed using the first mask.

4. The method of claim 1 wherein a second mask is used in forming the trenches.

5. The method of claim 4 wherein the first mask comprises photoresist.

6. The method of claim 1 wherein the first mask comprises one of oxide, nitride, and a composite layer including nitride and oxide.

7. The method of claim 1 wherein the first mask is formed over a surface of the semiconductor region before the trenches are formed and is used to define the trenches.

8. The method of claim 1 wherein the first mask is formed over a surface of the semiconductor region after forming the trenches.

9. The method of claim 1 wherein a bottom boundary of the body region has a corrugated profile.

10. The method of claim 1 wherein a bottom of the body region is deepest at sidewalls of the trenches and shallowest at a midpoint between adjacent trenches.

11. The method of claim 1 further comprising:
    prior to forming the gate electrode, forming a gate dielectric layer lining upper sidewalls of each trench and extending over the shield electrode, the gate dielectric layer being thinner than the shield dielectric.

12. The method of claim 1 further comprising:
    prior to forming the gate electrode:
        forming an inter-electrode dielectric layer extending over the shield electrode in each trench; and
        forming a gate dielectric layer lining upper sidewalls of each trench, the gate dielectric layer being thinner than the shield dielectric.

13. The method of claim 1 wherein the step of forming a recessed gate electrode comprises:
    filling the trenches with a conductive material; and
    recessing the conductive material in the trenches so that upper sidewalls of the trenches are not covered by the conductive material.

14. The method of claim 1 further comprising:
    removing the first mask;
    forming a dielectric material in each trench over the gate electrode; and
    forming an interconnect layer contacting the source regions and the body region.

15. The method of claim 1 wherein an implant energy in the range of about 150 KeV to about 220 KeV is used in forming the body region.

16. The method of claim 1 wherein the semiconductor region includes a silicon substrate and an epitaxial layer extending over the silicon substrate, and the trenches extend through the epitaxial layer and terminate in the silicon substrate.

17. The method of claim 1 wherein the semiconductor region includes a silicon substrate and an epitaxial layer extending over the silicon substrate, and the trenches terminate in the epitaxial layer.

18. The method of claim 1 wherein the semiconductor region comprises an epitaxial layer formed over a substrate of the second conductivity type to thereby form an IGBT.

19. The method of claim 1 wherein the body region is formed using a dual-pass angled implant.

20. The method of claim 1 wherein the source regions are formed using a dual-pass angled implant.

21. A method for forming a shielded gate field effect transistor (FET) comprising:
    forming a mask over a semiconductor region of a first conductivity type, the mask having openings through which the semiconductor region is exposed;
    forming trenches extending in the semiconductor region by recessing the semiconductor region through the mask openings;

forming a shield electrode in a bottom portion of each trench, the shield electrode being insulated from the semiconductor region by a shield dielectric;

forming a gate electrode recessed in each trench over the shield electrode, the gate electrode being insulated from the shield electrode;

using the first mask, forming a body region of a second conductivity type in the semiconductor region by implanting dopants, the first mask covering a top surface of the semiconductor region between adjacent trenches such that a substantial amount of the implant dopants enter the semiconductor region through upper trench sidewalls not covered by the recessed gate electrode; and using the first mask, forming source regions of the first conductivity type in the body region by implanting dopants.

22. The method of claim 21 wherein the mask comprises one of oxide, nitride, and a composite layer including nitride and oxide.

23. The method of claim 21 wherein a bottom boundary of the body region has a corrugated profile.

24. The method of claim 21 wherein a bottom of the body region is deepest at sidewalls of the trenches and shallowest at a midpoint between adjacent trenches.

25. The method of claim 21 further comprising:
prior to forming the gate electrode, forming a gate dielectric layer lining upper sidewalls of each trench and extending over the shield electrode, the gate dielectric layer being thinner than the shield dielectric.

26. The method of claim 21 further comprising:
prior to forming the gate electrode:
forming an inter-electrode dielectric layer extending over the shield electrode in each trench; and
forming a gate dielectric layer lining upper sidewalls of each trench, the gate dielectric layer being thinner than the shield dielectric.

27. The method of claim 21 wherein the step of forming a recessed gate electrode comprises:
filling the trenches with a conductive material; and
recessing the conductive material in the trenches so that the upper sidewalls of the trenches are not covered by the conductive material.

28. The method of claim 21 further comprising:
removing the mask;
forming a dielectric material in each trench over the gate electrode; and
forming an interconnect layer contacting the source regions and the body region.

29. The method of claim 21 wherein an implant energy in the range of about 150 KeV to about 220 KeV is used in forming the body region.

30. The method of claim 21 wherein the semiconductor region includes a silicon substrate and an epitaxial layer extending over the silicon substrate, and the trenches extend through the epitaxial layer and terminate in the silicon substrate.

31. The method of claim 21 wherein the semiconductor region includes a silicon substrate and an epitaxial layer extending over the silicon substrate, and the trenches terminate in the epitaxial layer.

32. The method of claim 21 wherein the semiconductor region comprises an epitaxial layer formed over a substrate of the second conductivity type to thereby form an IGBT.

33. The method of claim 21 wherein the body region is formed using a dual-pass angled implant.

34. The method of claim 21 wherein the source regions are formed using a dual-pass angled implant.

* * * * *